United States Patent
Qin et al.

(10) Patent No.: US 12,495,681 B2
(45) Date of Patent: Dec. 9, 2025

(54) OLED DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Shijian Qin, Guangdong (CN); Xiaotong Chen, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,043

(22) PCT Filed: Apr. 15, 2022

(86) PCT No.: PCT/CN2022/086984
§ 371 (c)(1),
(2) Date: Apr. 19, 2022

(87) PCT Pub. No.: WO2023/178759
PCT Pub. Date: Sep. 28, 2023

(65) Prior Publication Data
US 2024/0138193 A1   Apr. 25, 2024
US 2024/0237410 A9   Jul. 11, 2024

(30) Foreign Application Priority Data

Mar. 23, 2022 (CN) .......................... 202210290904.7

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/124* (2023.02); *H10K 59/873* (2023.02)

(58) Field of Classification Search
CPC .. H10K 59/122; H10K 59/124; H10K 59/123; H10K 59/131
See application file for complete search history.

(56) References Cited

U.S. PATENT DOCUMENTS

2015/0014636 A1*  1/2015  Kang ................... H10K 59/122
                                                            438/26
2019/0115561 A1*  4/2019  Tang ................... H10K 59/1213
(Continued)

FOREIGN PATENT DOCUMENTS

CN    107910347 A   4/2018
CN    110071225 A   7/2019
(Continued)

OTHER PUBLICATIONS

International Search Report in International application No. PCT/CN2022/086984, mailed on Nov. 30, 2022.
(Continued)

*Primary Examiner* — Lynne A Gurley
*Assistant Examiner* — Jonas T Beardsley
(74) *Attorney, Agent, or Firm* — PV IP PC; Wei Te Chung

(57) ABSTRACT

An organic light emitting diode (OLED) display panel includes a substrate, a thin film transistor (TFT) layer, a planarization layer, and a pixel definition layer which are arranged in sequence. The planarization layer is provided with first via holes, and the pixel definition layer is provided with second via holes and a through hole. Each first via holes communicates with one of the second via holes. The OLED display panel further includes a light-emitting device layer.
(Continued)

The light-emitting device layer includes an anode, a light-emitting layer, and a cathode sequentially arranged on one side of the planarization layer. The light-emitting layer is arranged in the through hole. The cathode covers the pixel definition layer, the first via hole, the second via hole, and the light-emitting layer.

16 Claims, 6 Drawing Sheets

(51) Int. Cl.
*H10K 59/124* (2023.01)
*H10K 59/80* (2023.01)

(56) References Cited

U.S. PATENT DOCUMENTS

| | | | |
|---|---|---|---|
| 2020/0144350 A1* | 5/2020 | Han | ............... H10K 59/126 |
| 2021/0233955 A1 | 7/2021 | Itou | |
| 2022/0100302 A1* | 3/2022 | Li | ..................... G06F 3/0446 |
| 2024/0260345 A1* | 8/2024 | Li | ..................... H10K 59/60 |

FOREIGN PATENT DOCUMENTS

| | | |
|---|---|---|
| CN | 110085648 A | 8/2019 |
| CN | 110649069 A | 1/2020 |
| CN | 111326548 A | 6/2020 |
| CN | 111883574 A | 11/2020 |
| CN | 112885870 A | 6/2021 |
| CN | 114171569 A | 3/2022 |

OTHER PUBLICATIONS

Written Opinion of the International Search Authority in International application No. PCT/CN2022/086984, mailed on Nov. 30, 2022.

Chinese Office Action issued in corresponding Chinese Patent Application No. 202210290904.7 dated Apr. 16, 2025, pp. 1-8.

\* cited by examiner

OLED DISPLAY PANEL AND MANUFACTURING METHOD THEREOF

FIELD OF DISCLOSURE

The present invention relates to a technical field of display panel technology and in particular, to an organic light emitting diode (OLED) display panel and a manufacturing method thereof.

DESCRIPTION OF RELATED ART

Compared with liquid-crystal displays (LCDs), organic light-emitting diode devices (OLEDs) have advantages of self-luminescence, fast response time, wide viewing angles, high brightness, bright colors, and thinness. In particular, due to being flexible, OLEDs are considered to be the next-generation display technology. According to the different light-emitting directions, two types of OLED are provided, that is, a bottom-emission OLED and a top-emission OLED. Use of the bottom-emission OLED is limited in high pixel density (pixels per inch or PPI) products because the bottom-emission OLED has relatively low aperture ratios. Large-sized top emission devices also have a problem that a voltage drop (IR Drop) occurs if transparent cathodes are too thick. In addition, because the ink-jet printing technology (IJP) is less expensive than evaporation deposition, IJP is also popular and used to produce OLEDs.

In the conventional top-emission products using inkjet printing technology, since RGB materials have requirements for leveling properties, it is necessary to place a planarization layer (PLN) and a pixel definition layer (PDL) above a thin film transistor (TFT) device. However, when encapsulation for the planarization layer and the pixel definition layer partially fails, external oxygen/moisture can easily enter TFTs and RGB light-emitting materials in a display area along the planarization layer and the pixel definition layer, which affects reliability of the device.

SUMMARY

It is an objective of the present invention to provide an organic light emitting diode (OLED) display panel and a manufacturing method thereof, which can effectively block and cut off an entering path of moisture and oxygen between adjacent light-emitting layers (pixels), thereby improving reliability of a display area and prolonging a service life of the OLED display panel.

Accordingly, the present application provides an organic light-emitting diode (OLED) display panel, comprising: a substrate, a thin film transistor (TFT) layer, a planarization layer, and a pixel definition layer. The TFT layer is disposed on one side of the substrate. The planarization layer is disposed on one side of the TFT layer away from the substrate. The pixel definition layer is disposed on one side of the planarization layer away from the TFT layer. A plurality of first via holes are defined in the planarization layer, a plurality of second via holes and a through hole are defined in the pixel definition layer, and each first via hole communicates with a corresponding one of the second via holes; the OLED display panel further comprises a light-emitting device layer; the light-emitting device layer comprises an anode, a light-emitting layer, and a cathode sequentially arranged on one side of the planarization layer away from the TFT layer; and the anode is electrically connected to the TFT layer, the light-emitting layer is disposed in the through hole, and the cathode covers the pixel definition layer, the first via holes, the second via holes, and the light-emitting layer.

In the OLED display panel of the present application, the OLED display panel comprises a display area and a non-display area disposed at a periphery of the display area, and at least one of the first via holes and at least one of the second via holes are defined between the display area and the non-display area.

In the OLED display panel of the present application, the display area comprises a plurality of pixel units, and between at least two adjacent pixel units, one of the first via holes and one of the second via holes are defined.

In the OLED display panel of the present application, the OLED display panel further comprises an encapsulation layer, the planarization layer and the pixel definition layer are disposed in the display area, the planarization layer comprises a first side surface close to the non-display area, the pixel definition layer comprises a second side surface close to the non-display area, and the encapsulation layer covers the cathode of the display area, the first side surface, and the second side surface.

In the OLED display panel of the present application, the OLED display panel further comprises a first metal layer disposed between the substrate and the TFT layer, the TFT layer comprises a plurality of TFTs arranged in an array pattern and a plurality of third via holes defined between the TFTs, and one of the third via holes is defined at a position corresponding to one of the first via holes.

In the OLED display panel of the present application, the first metal layer comprises a light shielding layer arranged corresponding to the TFTs and a first metal trace layer arranged corresponding to one of the first via holes, and the cathode is electrically connected to the first metal trace layer through the corresponding third via hole.

In the OLED display panel of the present application, the TFT layer comprises a buffer layer, a semiconductor layer, a gate insulating layer, a gate layer, an interlayer dielectric layer, and a second metal layer sequentially arranged on one side of the first metal layer away from the substrate; the second metal layer comprises a source-drain layer connected to the semiconductor layer and a first metal trace electrode disposed corresponding to the first metal trace layer; and the first metal trace electrode electrically connects the cathode to the first metal trace layer through the corresponding third via hole.

In the OLED display panel of the present application, the OLED display panel further comprises a third metal layer disposed on one side of the TFT layer away from the substrate, the third metal layer comprises the anode and a second metal trace electrode disposed in a same layer as the anode, and the second metal trace electrode is electrically connected to the first metal trace electrode.

In the OLED display panel of the present application, one of the first via holes and one of the second via holes communicating with each other expose at least a portion of the second metal trace electrode, and wherein the cathode is connected to the second metal trace electrode through the first via hole and the second via hole.

The present application further provides a manufacturing method of an organic light emitting diode (OLED) display panel, comprising following steps:
   providing a substrate;
   forming a thin film transistor (TFT) layer on one side of the substrate;
   forming a planarization layer on one side of the TFT layer away from the substrate; and forming a pixel definition layer on one side of the planarization layer away from the TFT layer;
wherein a plurality of first via holes are formed in the planarization layer, a plurality of second via holes and a through hole are formed in the pixel definition layer, and each of the first via holes communicates with one of the second via holes; and the OLED display panel further includes a light-emitting device layer, the light-emitting device layer includes an anode, a light-emitting layer, and a cathode sequentially formed on one side of the planarization layer away from the TFT layer, the anode is electrically connected to the TFT layer, the light-emitting layer is formed in the through hole, and the cathode covers the pixel definition layer, the first via holes, the second via holes, and the light-emitting layer.

In the manufacturing method of the OLED display panel according to the present application, the OLED display panel comprises a display area and a non-display area disposed at a periphery of the display area, and at least one of the first via holes and at least one of the second via holes are defined between the display area and the non-display area.

In the manufacturing method of the OLED display panel according to the present application, the display area comprises a plurality of pixel units, and between at least two adjacent pixel units, one of the first via holes and one of the second via holes are defined.

In the manufacturing method of the OLED display panel according to the present application, the OLED display panel further comprises an encapsulation layer, the planarization layer and the pixel definition layer are disposed in the display area, the planarization layer comprises a first side surface close to the non-display area, the pixel definition layer comprises a second side surface close to the non-display area, and the encapsulation layer covers the cathode of the display area, the first side surface, and the second side surface.

In the manufacturing method of the OLED display panel according to the present application, the OLED display panel further comprises a first metal layer disposed between the substrate and the TFT layer, the TFT layer comprises a plurality of TFTs arranged in an array pattern and a plurality of third via holes defined between the TFTs, and one of the third via holes is defined at a position corresponding to one of the first via holes.

In the manufacturing method of the OLED display panel according to the present application, the first metal layer comprises a light shielding layer arranged corresponding to the TFTs and a first metal trace layer arranged corresponding to one of the first via holes, and the cathode is electrically connected to the first metal trace layer through the corresponding third via hole.

In the manufacturing method of the OLED display panel according to the present application, the TFT layer comprises a buffer layer, a semiconductor layer, a gate insulating layer, a gate layer, an interlayer dielectric layer, and a second metal layer sequentially arranged on one side of the first metal layer away from the substrate; the second metal layer comprises a source-drain layer connected to the semiconductor layer and a first metal trace electrode disposed corresponding to the first metal trace layer; and the first metal trace electrode electrically connects the cathode to the first metal trace layer through the corresponding third via hole.

In the manufacturing method of the OLED display panel according to the present application, the OLED display panel further comprises a third metal layer disposed on one side of the TFT layer away from the substrate, the third metal layer comprises the anode and a second metal trace electrode disposed in a same layer as the anode, and the second metal trace electrode is electrically connected to the first metal trace electrode.

In the manufacturing method of the OLED display panel according to the present application, one of the first via holes and one of the second via holes communicating with each other expose at least a portion of the second metal trace electrode, and wherein the cathode is connected to the second metal trace electrode through the first via hole and the second via hole.

In the manufacturing method of the OLED display panel according to the present application, the pixel definition layer further comprises a hydrophilic organic layer and a hydrophobic layer deposited on the hydrophilic organic layer, and a thickness of the hydrophilic organic layer is greater than or equal to a thickness of the hydrophobic layer.

In the manufacturing method of the OLED display panel according to the present application, the encapsulation layer further comprises a first inorganic encapsulation layer, an organic encapsulation layer inkjet printed on the first inorganic encapsulation layer, and a second inorganic encapsulation layer deposited on the organic encapsulation layer, or a combination thereof, the first inorganic encapsulation layer and the second inorganic encapsulation layer are made of silicon oxide, and the organic encapsulation layer is made of silicon nitride or silicon oxynitride.

Advantages of the Present Application

In the light-emitting layer (in each pixel unit) of the display area, the via holes (i.e., the first via holes and the second via holes communicating each other) are defined in the pixel definition layer and the planarization layer. The via holes between the pixel units can effectively block moisture and oxygen from entering the pixel definition layer and the planarization layer. Accordingly, even if encapsulation for one single pixel unit fails, normal operations of other pixel units are not affected, thereby increasing reliability of display operations of most of the pixel units in the display area and prolonging a service life of the OLED display panel. The third via hole is formed between the TFTs and corresponding to the first via hole, and the cathode is electrically connected to the first metal trace layer (as a ground voltage trace, VSS) disposed corresponding to the first via hole through the third via hole, which can also effectively reduce a voltage drop (IR drop) of the large-sized OLED display panel having a top emission structure, thereby achieving uniform display. In addition, the pixel definition layer and the planarization layer can be not disposed in the non-display area. That is to say, the non-display area is fully covered by the encapsulation layer, which effectively prevents entry of external oxygen and moisture, thereby increasing reliability and a service life of most of devices in the display area.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Reference to "embodiment" means that particular features, structures, or characteristics described in connection with the embodiment can be included in at least one embodiment of the present invention. The same term appears in different places in the specification are not necessarily limited to the same embodiment, but rather should be understood as mutually independent embodiments or alternative embodiments to other embodiments. In light of the technical solutions disclosed in the embodiments provided in the present invention, those of ordinary skill in the art can understand that the embodiments described in the present invention can have combinations or changes based on the concept of the technical solutions of the present invention.

Figure 1A:
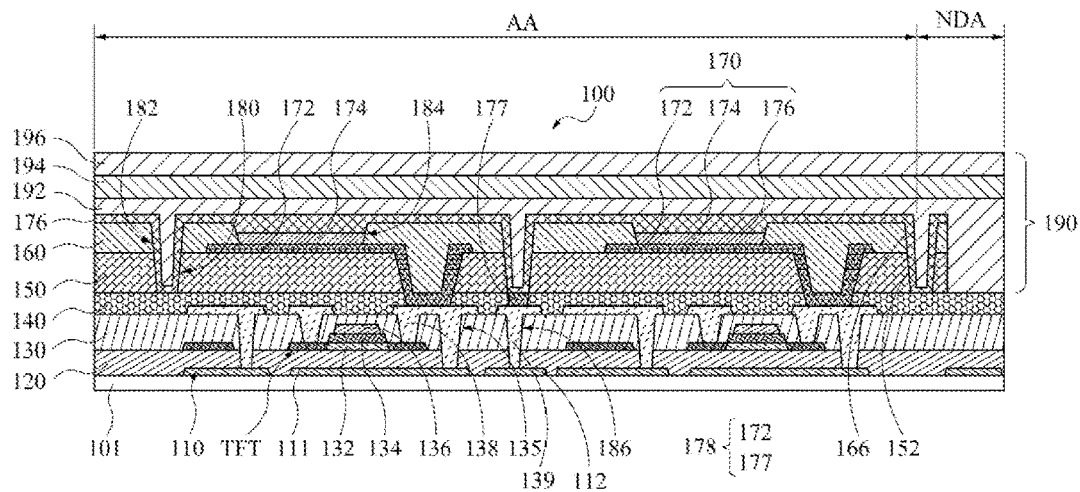
FIG. 1A is a first cross-sectional view of an organic light emitting diode (OLED) display panel according to the present invention.
Figure 1B:
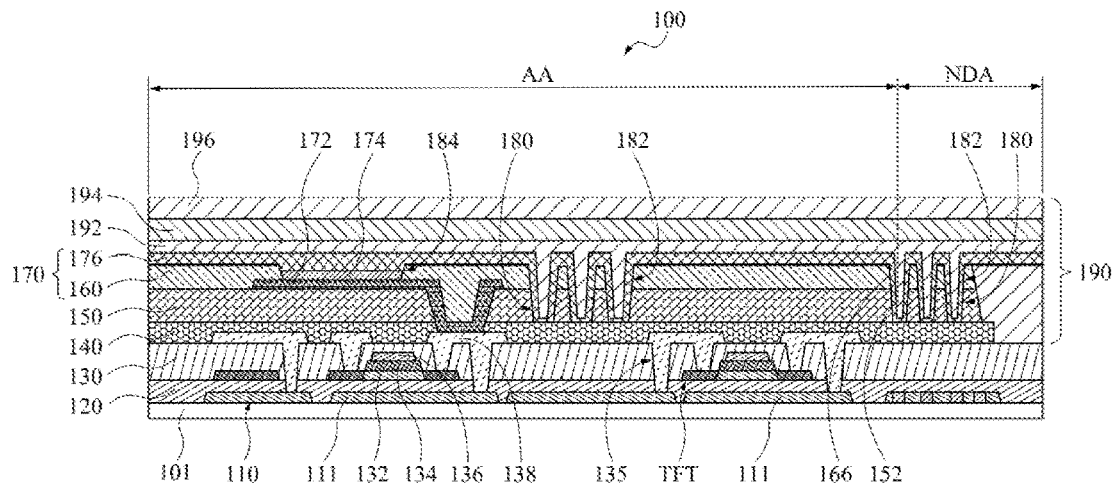
FIG. 1B is a second cross-sectional view of the OLED display panel according to the present invention.

Please refer to FIG. 1A and FIG. 1B, which are first and second cross-sectional views of an organic light emitting diode (OLED) display panel according to one embodiment of the present invention. The present invention provides an OLED display panel 100 including a substrate 101, a thin film transistor (TFT) layer (not labeled), a planarization layer 150, and a pixel definition layer 160. The TFT layer is disposed on one side of the substrate 101. The planarization layer 150 is disposed on one side of the TFT layer away from the substrate 101. The pixel definition layer 160 is disposed on one side of the planarization layer 150 away from the TFT layer. The planarization layer 150 is provided with a plurality of first via holes 180, the pixel definition layer 160 is provided with a plurality of second via holes 182 and a through hole 184, and each of the first via holes 180 communicates with a corresponding one of the second via holes 182.

The OLED display panel 100 further includes a light-emitting device layer 170, and the light-emitting device layer 170 includes an anode 172, a light-emitting layer 174 and a cathode 176, which are sequentially arranged on one side of the planarization layer 150 away from the TFT layer. The anode 172 is electrically connected to the TFT layer, the light-emitting layer 174 is disposed in the through hole 184, and the cathode 176 covers the pixel definition layer 160, the first via holes 180, the second via holes 182, and the light-emitting layer 174. In the embodiment shown in FIG. 1A and FIG. 1B, the OLED display panel 100 includes a display area AA and a non-display area NDA arranged at a periphery of the display area AA, and at least one of the first via holes 180 and at least one of the second via holes 182 are defined between the display area AA and the non-display area NDA.

Figure 2:
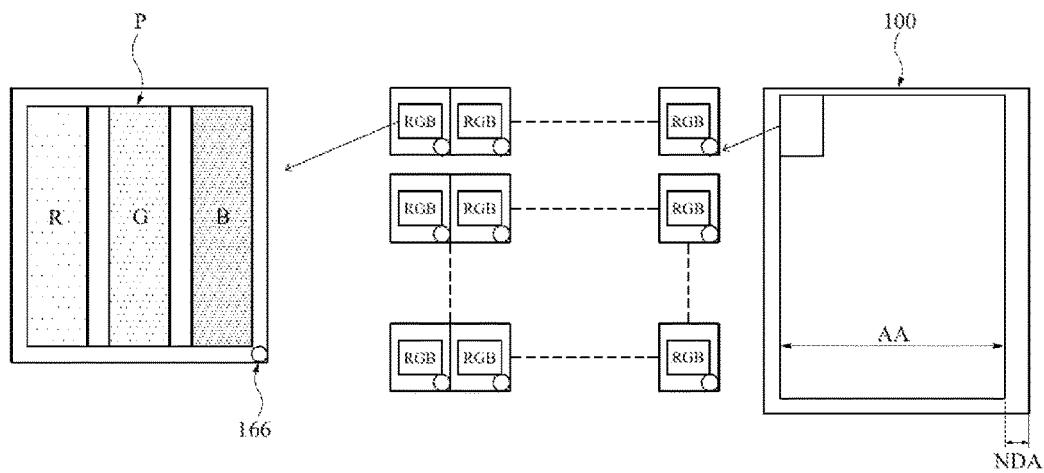
FIG. 2 is a schematic plan view of the OLED display panel of the present invention.

Please also refer to FIG. 2, which is a schematic plan view of the OLED display panel of the present invention. The display area AA includes a plurality of pixel units P, and each pixel unit P includes at least three sub-pixels, such as a red sub-pixel, a green sub-pixel, and a blue sub-pixel. In one embodiment, the first via hole 180 and the second via hole 182 are defined between at least two adjacent pixel units P. The embodiment shown in FIG. 1A at least includes one first via hole 180 and one second via hole 182 communicating with each other and defined between two adjacent pixel units P. However, the embodiment shown in FIG. 1B includes three first via holes 180 and three second via holes 182 communicating with each other between two adjacent pixel units P, thereby better preventing external moisture and oxygen from entering the pixel units P.

To be specific, there are three first via holes 180 and three second via holes 182 communicating with each other close to the non-display area NDA (but the present application is not limited in this regard), and the first and second via holes 180, 182 close to the non-display area NDA have a greater quantity as compared to one first via hole 180 and one second via hole 182 defined in the display area AA. However, in alternative embodiments, the first and second via holes 180, 182 close to the non-display area NDA can also have a quantity equal to the quantity of the first and second via holes 180, 182 defined in the display area AA, and the quantity can be changed as needed. In the embodiment shown in FIG. 1A and FIG. 2, a propagation path of oxygen/moisture is effectively cut off by the first via hole 180 and the second via hole 182, and therefore, even if one single pixel unit P has encapsulation failure, it does not affect normal operations of other pixel units P, thereby improving reliability of display operations of most of pixels in the display area AA and prolonging a service life of the OLED display panel 100. As shown in FIG. 1A and FIG. 1B, the OLED display panel 100 further includes an encapsulation layer 190, and the planarization layer 150 and the pixel definition layer 160 are disposed in the display area AA. The planarization layer 150 and the pixel definition layer 160 are disposed in the display area AA. The planarization layer 150 includes a first side surface 152 close to the non-display area NDA, the pixel definition layer 160 includes a second side surface 166 close to the non-display area NDA. The encapsulation layer 190 covers the cathode 176 of the display area AA, the first side surface 152, and the second side surface 166. Specifically, in the non-display area NDA, the pixel definition layer 160 and the planarization layer 150 are not disposed. That is to say, the non-display area NDA is fully covered by the encapsulation layer 190 to effectively prevent entry of external oxygen and moisture, thereby improving reliability and prolonging a service life of most devices in the display area AA.

The encapsulation layer 190 shown in FIG. 1A and FIG. 1B further includes a first inorganic encapsulation layer 192, an organic encapsulation layer 194, and a second inorganic encapsulation layer 196. However, in other different embodiments, the encapsulation layer 190 further includes the above three layers or more layers or layers of other different combinations, and the present application is not limited in this regard. The first inorganic encapsulation layer 192 and the second inorganic encapsulation layer 196 are preferably made of silicon oxide (SiO), and the organic encapsulation layer 194 is preferably made of silicon nitride (SiN) or silicon oxynitride (SiNxOy).

Figure 3:
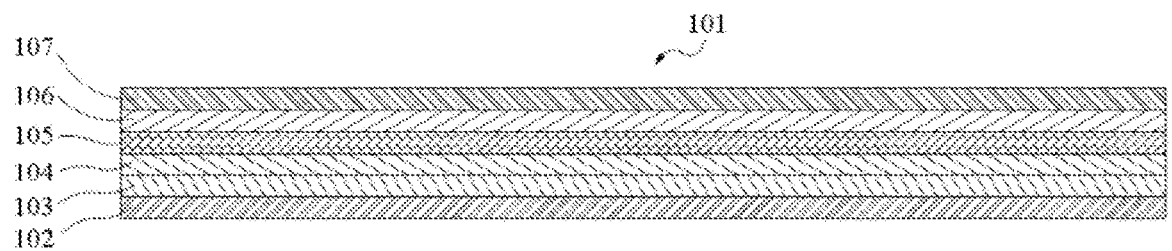
FIG. 3 is a cross-sectional structural view of a substrate in FIG. 1A or FIG. 1B.

Also referring to FIG. 3, the substrate 101 in this embodiment can be a rigid layer or a flexible layer. In the case where the substrate 101 is a rigid layer, it can be plain glass, PE resin, or other suitable material. In the case where the substrate 101 is a flexible layer, a single-layer structure or a multi-layer structure which is composed of a plurality of polyimide (PI) layers and a plurality of barrier layers can be disposed on the plain glass; however, the present application is not limited in this regard. Specifically, as shown in FIG. 3, the substrate 101 further includes a substrate 102 (plain glass), an amorphous silicon layer 103 (serving as a sacrificial layer), a first photoresist layer 104 (polyimide or PI for short), a first barrier layer 105 (made of silicon oxide for example), a second photoresist layer 106 (polyimide or PI for short), and a second barrier layer 107 (made of SiO for example), or a combination thereof.

The OLED display panel 100 further includes a first metal layer 110 disposed between the substrate 101 and the TFT layer. The TFT layer includes a plurality of TFTs arranged in an array pattern and a third via hole 186 between the TFTs. The third via hole 186 is defined corresponding to the first via hole 180. The first metal layer 110 includes a light shielding layer 111 disposed corresponding to the TFT and a first metal trace layer 112 disposed corresponding to the first via hole 180. The cathode 176 is electrically connected to the first metal trace layer 112 through the third via hole 186.

Specifically, the TFT layer includes a buffer layer 120, a semiconductor layer (IGZO/IGTO) 132, a gate insulating layer 134, and a gate layer 136, an interlayer dielectric layer (ILD) 130, and a second metal layer 135 sequentially disposed on one side of the first metal layer 110 away from the substrate 101. The second metal layer 135 includes a source-drain layer 138 connected to the semiconductor layer 132 and a first metal trace electrode 139 disposed corresponding to the first metal trace layer 112. The first metal trace electrode 139 electrically connects the cathode 176 to the first metal trace layer 112 through the third via hole 186.

The OLED display panel 100 further includes a third metal layer 178 disposed on one side of the TFT layer away from the substrate 101. The third metal layer 178 includes the anode 172 and a second metal trace electrode 177 disposed in a same layer as the anode 172. The second metal trace electrode 177 is electrically connected to the first metal trace electrode 139. The first via hole 180 and the second via hole 182 communicating the first via hole 180 expose at least a portion of the second metal trace electrode 177. The cathode 176 is connected to the second metal trace electrode 177 through the first via hole 180 and the second via hole 182.

Therefore, in the present embodiment, by defining the third via hole 186 between the TFTs, the cathode 176 is electrically connected to the first metal trace layer 112 (as a ground voltage trace, VSS) through the third via hole 186, which can effectively reduce a voltage drop (IR drop) of the large-sized OLED display panel 100 having a top-emission structure, thereby achieving more uniform display.

Figure 4:
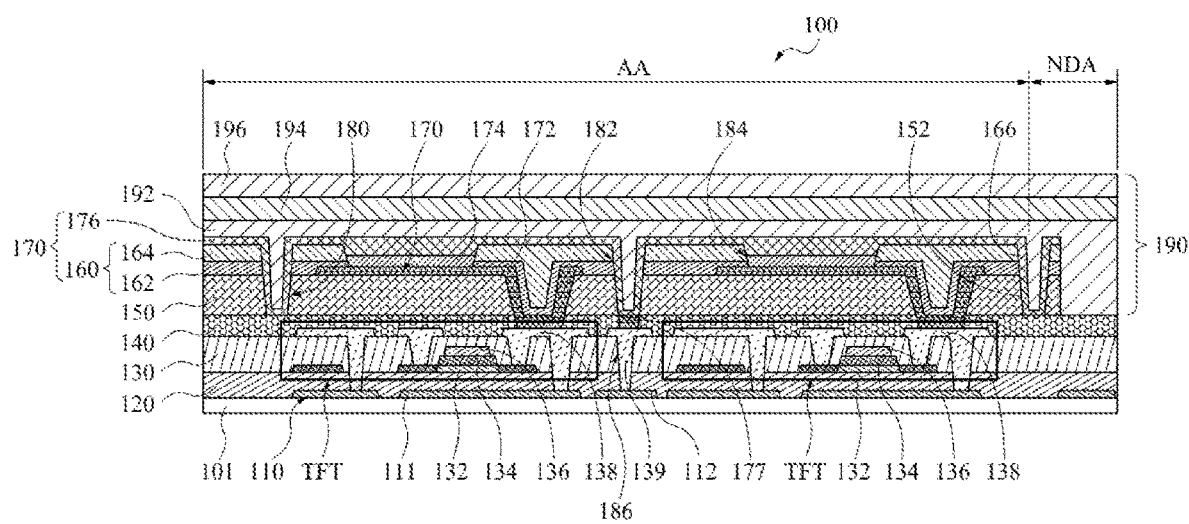
FIG. 4 is a schematic view of the OLED display panel according to another embodiment of the present invention.

Please also refer to FIG. 4, which is a schematic view of the OLED display panel according to another embodiment of the present invention. In the present embodiment, in order to better improve inkjet printing quality, the pixel definition layer 160 can have two layers which include a hydrophilic organic layer 162 and a hydrophobic layer 164 deposited on the hydrophilic organic layer 162. Specifically, a bottom layer of the pixel definition layer 160 is the hydrophilic organic layer 162, so that ink can be spread out to the greatest extent, and a top layer of the pixel definition layer 160 is the hydrophobic layer 164, so that ink does not remain on a surface of the pixel definition layer 160. A thickness of the hydrophilic organic layer 162 is greater than or equal to a thickness of the hydrophobic layer 164. In a preferable embodiment, a thickness of the hydrophilic organic layer 162 is 4000 Å, and a thickness of the hydrophobic layer 164 is 10000 Å.

Please also refer to FIG. 5 to FIG. 17, which are schematic cross-sectional views and a process flow diagram illustrating a manufacturing method of an organic light emitting diode (OLED) display panel of the present invention. The present invention also provides a manufacturing method of a flexible OLED display panel 100, and the manufacturing method includes following steps:

Step S10: providing a substrate 101. Step S20: forming a thin film transistor (TFT) layer (not labeled) on one side of the substrate 101. Step S30: forming a planarization layer 150 on one side of the TFT layer away from the substrate 101. Step S40: forming a pixel definition layer 160 on one side of the planarization layer 150 away from the TFT layer. A plurality of first via holes 180 are formed in the planarization layer 150, a plurality of second via holes 182 and a through hole 184 are formed in the pixel definition layer 160, and each first via holes 180 communicates with a corresponding one of the second via holes 182.

The OLED display panel 100 further includes a light-emitting device layer 170. The light-emitting device layer 170 includes an anode 172, a light-emitting layer 174, and a cathode 176 formed in sequence on one side of the planarization layer 150 away from the TFT layer. The anode 172 is electrically connected to the TFT layer. The light-emitting layer 174 is formed in the through hole 184. The cathode 176 covers the pixel definition layer 160, the first via holes 180, the second via holes 182, and the light-emitting layer 174.

As shown in FIG. 1A and FIG. 1B, the OLED display panel 100 includes a display area AA and a non-display area NDA at a periphery of the display area AA. The first via hole 180 and the second via hole 182 are formed between the display area AA and the non-display area NDA. The display area AA includes a plurality of pixel units P. The first via hole 180 and the second via hole 182 are formed between at least two adjacent pixel units P. Each pixel unit P includes at least three sub-pixels, such as a red sub-pixel, a green sub-pixel, and a blue sub-pixel. There are, but not limited to, three first via holes 180 and three second via holes 182 communicating with each other close to the non-display area NDA. The first and second via holes 180, 182 close to the non-display area NDA have a greater quantity than one first via hole 180 and one second via hole 182 defined in the display area AA. However, in alternative embodiments, the first via holes 180 and the second via holes 182 close to the non-display area NDA can also have a quantity equal to a quantity of the first via holes 180 and the second via holes 182 defined in the display area AA, and the quantity can be changed as needed. A propagation path of oxygen/moisture is effectively cut off by the first via hole 180 and the second via hole 182, and therefore, even if one single pixel unit P has encapsulation failure, it does not affect normal operations of other pixel units P, thereby improving reliability of display operations of most of pixels in the display area AA and prolonging a service life of the OLED display panel 100.

In step S10 of providing the substrate 101, as shown in FIG. 3, the substrate 101 can be a rigid layer or a flexible layer. In the case where the substrate 101 is a rigid layer, it can be plain glass, PE resin, or other suitable material. In the case where the substrate 101 is a flexible layer, then a single-layer structure or a multi-layer structure which is composed of a plurality of polyimide (PI) layers and a plurality of barrier layers can be disposed on the plain glass;

however, the present application is not limited in this regard. Specifically, as shown in FIG. 3, the substrate 101 further includes a substrate 102 (plain glass), an amorphous silicon layer 103 (Asi as a sacrificial layer) deposited on the substrate 102 by chemical vapor deposition (CVD), a first photoresist layer 104 (formed by applying a coating of polyimide, i.e., PI, and drying the coating by VCD), a first barrier layer 105 (a material is, for example, silicon oxide) deposited by VCD, a second photoresist layer 106 (formed by applying a coating of polyimide, i.e., PI, and drying the coating by VCD), a second barrier layer (a material is, for example, silicon oxide) deposited by VCD. However, in other different embodiments, the substrate 101 can also include a multi-layer structure as in the embodiment of FIG. 3 or a combination thereof, and the present application is not limited in this regard.

In step S20 of forming the TFT layer on one side of the substrate 101, as shown in FIG. 5 to FIG. 9, the OLED display panel 100 further includes forming a first metal layer 110 between the substrate 101 and the TFT layer. The TFT layer includes a plurality of TFTs arranged in an array pattern and a third via hole 186 formed between the TFTs. The third via hole 186 is formed in a position corresponding to the first via hole 180, and the first metal layer 110 includes a light shielding layer 111 formed corresponding to the TFT and a first metal trace layer 112 formed in a position corresponding to the first via hole 180. The cathode 176 is electrically connected to the first metal trace layer 112 through the third via hole 186.

In the embodiments shown in FIG. 5 to FIG. 9, the TFT layer includes a buffer layer 120, a semiconductor layer 132, and a gate insulating layer 134, a gate layer 136, an interlayer dielectric layer 130, and a second metal layer 135 that are sequentially arranged on one side of the first metal layer 110 away from the substrate 101. The second metal layer 135 includes a source-drain layer 138 connected to the semiconductor layer 132 and a first metal trace electrode 139 formed in a position corresponding to the first metal trace layer 112. The first metal trace electrode 139 electrically connects the cathode 176 to the first metal trace layer 112 through the third via hole 186.

Figure 5:
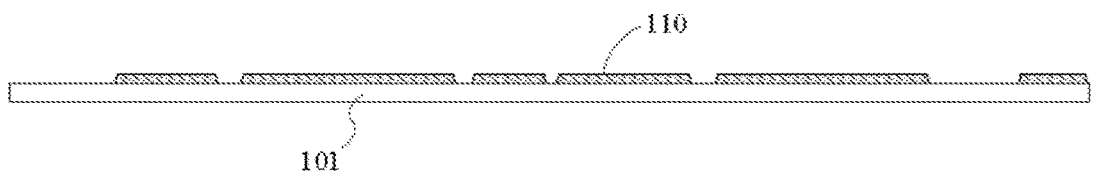
FIGS. 5 to 16 are cross-sectional structural views illustrating a manufacturing method of the OLED display panel of the present invention.
Figure 6:
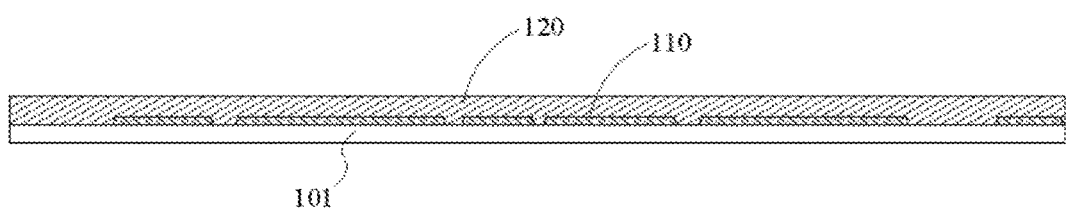

Specifically, the first metal layer 110 is a single layer or multiple layers composed of, for example, copper (Cu), molybdenum (Mo), titanium (Ti), aluminum (Al), or an alloy thereof. The first metal layer 110 is deposited on the substrate 101 by physical vapor deposition (PVD) to serve as a light shielding layer 111 (LS layer), and then subjected to photoresist coating, exposure, development, etching, peeling to form a cross-sectional view as shown in FIG. 5. The first metal layer 110 can be used to shield light from the outside and prevent current leakage from occurring in the TFT layer. In the embodiment shown in FIG. 5, a buffer layer 120 is deposited by CVD and can be composed of silicon nitride, silicon oxide, or a combination of both, to form the cross-sectional view shown in FIG. 6.

Figure 7:
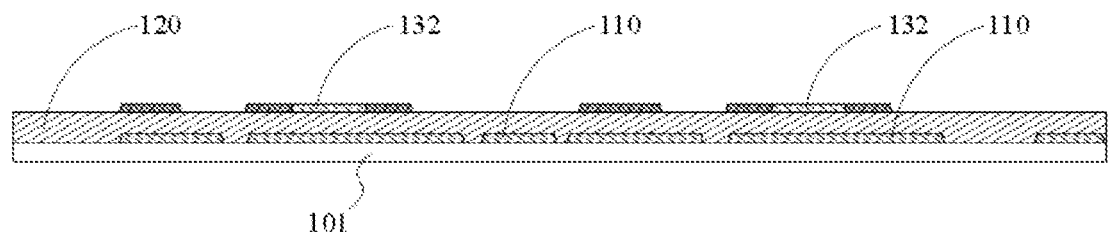
Figure 8:
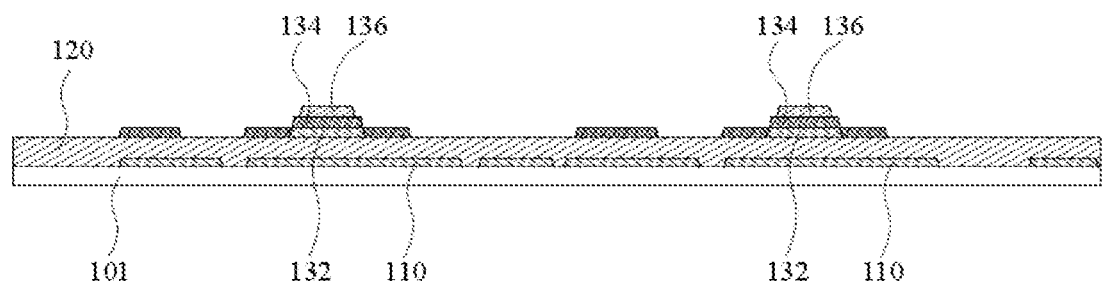
Figure 9:
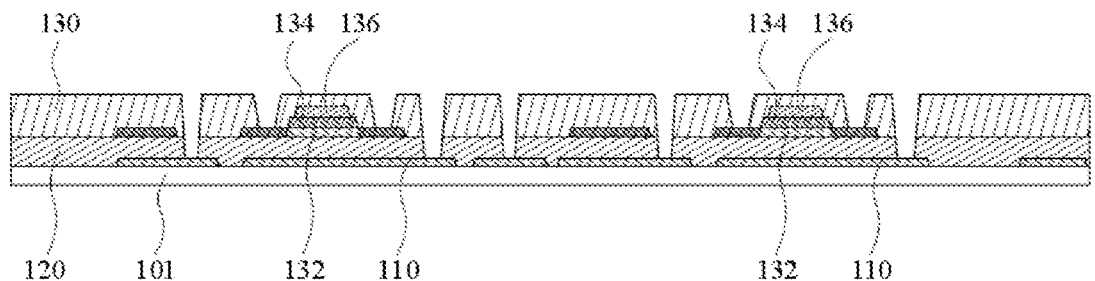

In the embodiment shown in FIG. 7, the semiconductor layer 132 formed by PVD through depositing semiconductor materials such as indium zinc tin oxide (IZTO), indium aluminum zinc oxide (IAZO), indium gallium zinc oxide (IGZO), indium gallium tin oxide (IGTO), or alloy thereof to form a single-layer or multi-layer structure. Then, operations such as photoresist coating, exposure, development, etching, and peeling are performed to form the cross-sectional view of FIG. 8. In the embodiment shown in FIG. 8, the gate insulating layer 134 is deposited by CVD and can be composed of silicon nitride, silicon oxide or a combination of both. The gate layer 136 is a single-layer or multi-layer structure composed of materials such as copper (Cu), molybdenum (Mo), titanium (Ti), aluminum (Al), and alloys thereof, and is made by performing PVD and then performing photoresist coating, exposure, development, etching, and peeling to form the cross-sectional view as shown in FIG. 8. It should be noted that, in the above etching step, a pattern of the gate layer 136 is first etched by a wet etching process, and then a pattern of the gate insulating layer 134 is etched by a dry etching process, and helium (He) is used to realize conductivity to form the embodiment shown in FIG. 8.

In the embodiment shown in FIG. 8, the dielectric layer 130 (ILD) is deposited by CVD and can be composed of silicon nitride, silicon oxide, or a combination of both. Then, operations such as photoresist coating, exposure, development, etching, and peeling are performed to form the cross-sectional view shown in FIG. 9. In particular, a photomask for fabricating the dielectric layer 130 is used to synchronously etch the dielectric layer 130 and the buffer layer 120 in a half-tone manner. In the embodiment shown in FIG. 9, the second metal layer 135 is a single-layer or multiple-layer structure composed of materials such as copper (Cu), molybdenum (Mo), titanium (Ti), aluminum (Al), or an alloy thereof, and PVD deposition is performed to form the second metal layer 135, and then operations such as photoresist coating, exposure, development, etching, and peeling are performed to form the cross-sectional view as shown in FIG. 10.

It should be noted that the TFT layer includes multiple TFTs arranged in an array pattern and a third via hole 186 formed between the TFTs. The third via hole 186 is formed corresponding to the first via hole 180. The first metal layer 110 includes the light shielding layer 111 formed corresponding to the TFT and the first metal trace layer 112 formed corresponding to the first via hole 180. The cathode 176 is electrically connected to the first metal trace layer 112 through the third via hole 186. In addition, the second metal layer 135 includes a source-drain layer 138 connected to the semiconductor layer 132 and the first metal trace electrode 139 formed corresponding to the first metal trace layer 112. In an example, the first metal trace electrode 139 is formed in a same layer and composed of a same material as the source-drain layer 138. The first metal trace electrode 139 electrically connects the cathode 176 to the first metal trace layer 112 through the third via hole 186.

Figure 10:
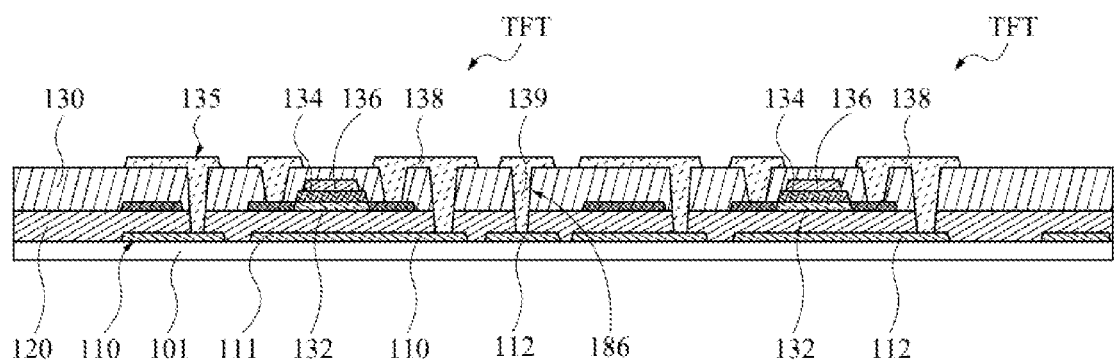
Figure 11:
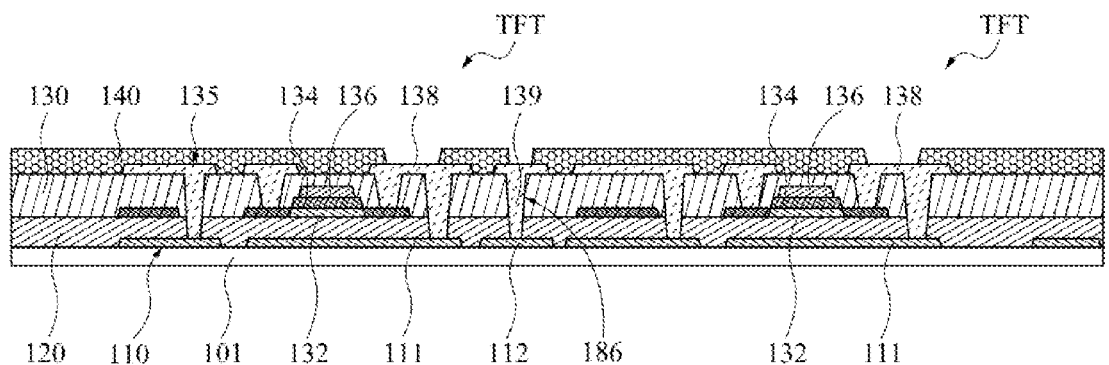

Referring to FIG. 10, in step S30 of forming the planarization layer 150 on one side of the TFT layer away from the substrate 101, the passivation layer 140 is formed by performing CVD to deposit a material such as silicon nitride, silicon oxide, or a combination of both. Then, operations including photoresist coating, exposure, development, etching, and peeling are performed to form the cross-sectional view as shown in FIG. 11. In the embodiment shown in FIG. 11, the planarization layer 150 is coated using a coating device, and the cross-sectional view shown in FIG. 12 is formed by ashing after exposure, development, and baking.

The OLED display panel 100 further includes a third metal layer 178 formed on one side of the TFT layer away from the substrate 101. The third metal layer 178 includes the anode 172 and a second metal trace electrode 177 formed in a same layer as the anode 172. The second metal trace electrode 177 is, for example, in a same layer and composed of a same material as the anode 172. The second metal trace electrode 177 is electrically connected to the first metal trace electrode 139. The first via hole 180 and the second via hole 182 communicating with the first via hole 180 expose at least a portion of the second metal trace electrode 177. The cathode 176 is connected to the second metal trace electrode 177 through the first via hole 180 and the second via hole 182. Accordingly, in the present embodiment, by forming the third via hole 186 between the TFTs, the cathode 176 is electrically connected to the first metal trace layer 112 (as a ground voltage trace, VSS) through the third via hole 186, which can effectively reduce a voltage drop (IR drop) the large-sized OLED display panel 100 as a top-emission device, thereby achieving more uniform display.

Figure 12:
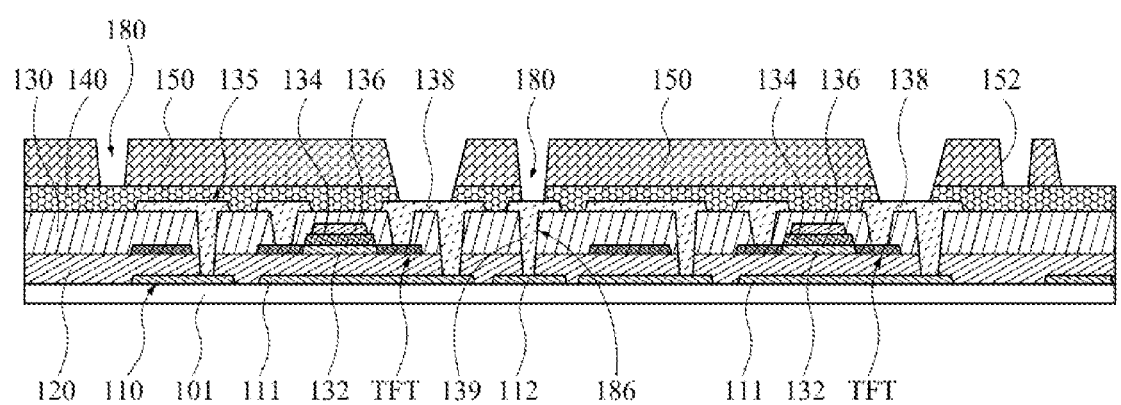

In the embodiment shown in FIG. 12, the anode 172 (e.g., ITO/Ag/ITO, IZO/Ag/IZO, or other layered sandwich structure constituted by transparent conductive layers and silver (Ag)) is deposited by PVD to serve as another electrode trace for the pixel electrode, the auxiliary electrode, and/or the touch electrode of the OLED display panel 100. Then, operations including photoresist coating, exposure, development, etching, and peeling are carried out to form the cross-sectional view as shown in FIG. 13.

Figure 13:
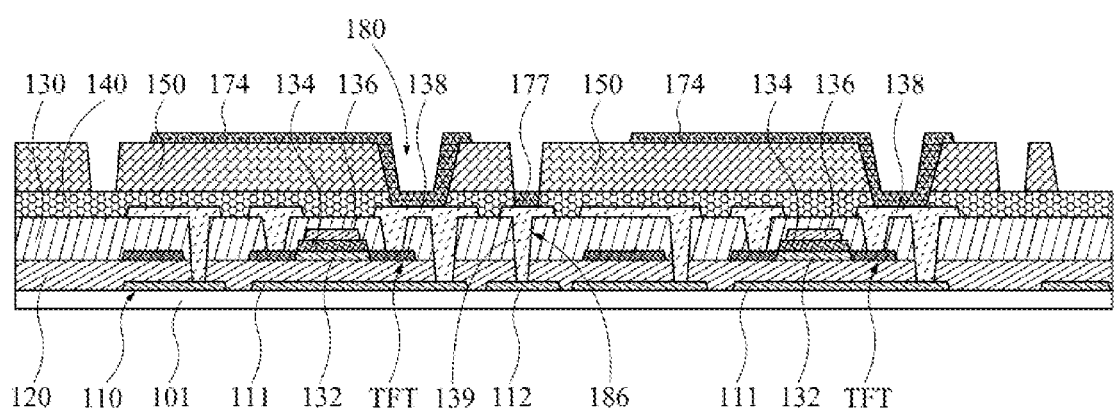
Figure 14:
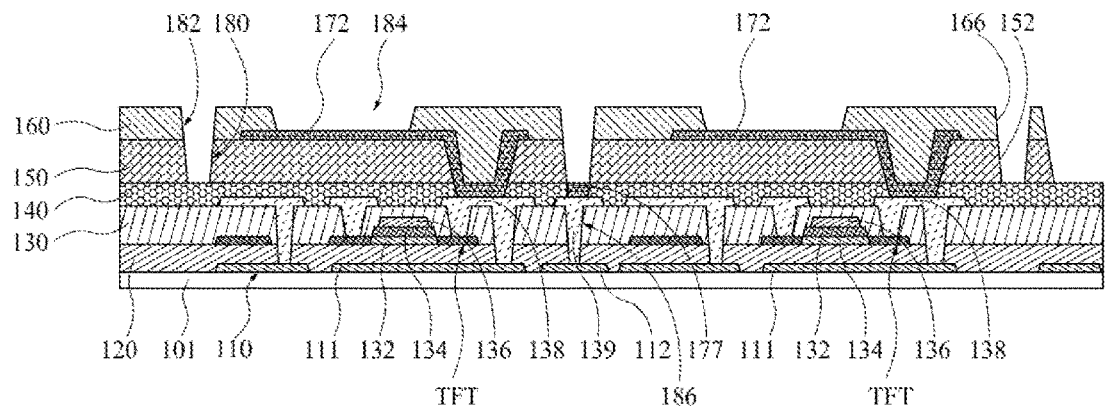

In step S40 of forming the pixel definition layer 160 on one side of the planarization layer 150 away from the TFT layer, as shown in FIG. 13, the pixel definition layer 160 (PDL/BANK) is coated with a coating device. Then, exposure, development, and baking are performed to form the cross-sectional view as shown in FIG. 14. In particular, the planarization layer 150 and the pixel definition layer 160 are formed in the display area AA, the planarization layer 150 is formed with a first side surface 152 adjacent to the non-display area NDA, and the pixel definition layer 160 is formed with a second side surface 166 adjacent to the non-display area NDA. The encapsulation layer 190 covers the cathode 176 of the display area AA, the first side surface 152, and the second side surface 166. Specifically, in the non-display area NDA, the pixel definition layer 160 and the planarization layer 150 are not disposed, that is, the non-display area NDA is fully covered by the encapsulation layer 190 to effectively prevent entry of external oxygen/moisture, thereby improving reliability and prolonging a service life of most devices in the display area AA.

Figure 15:
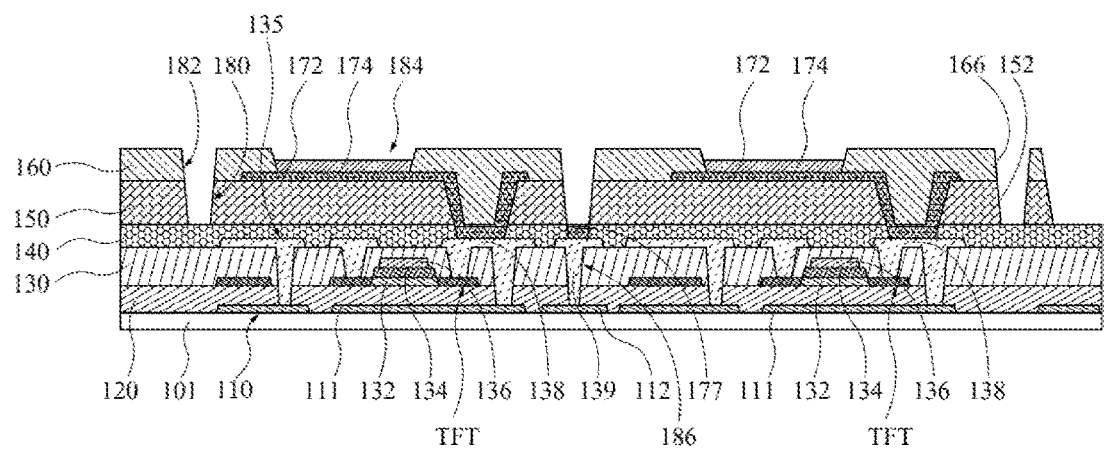
Figure 16:
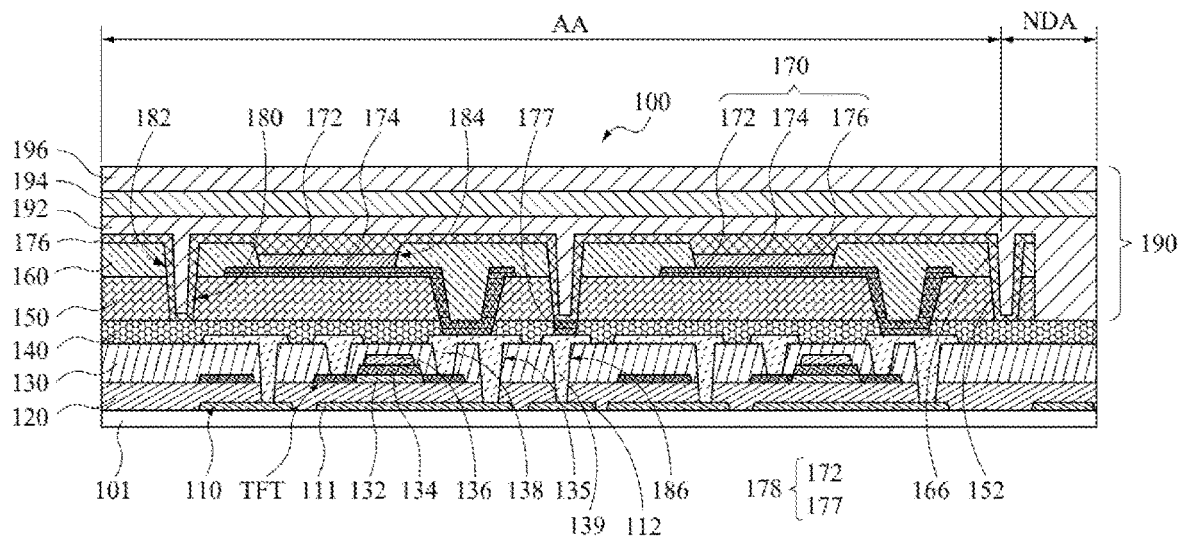
Figure 17:
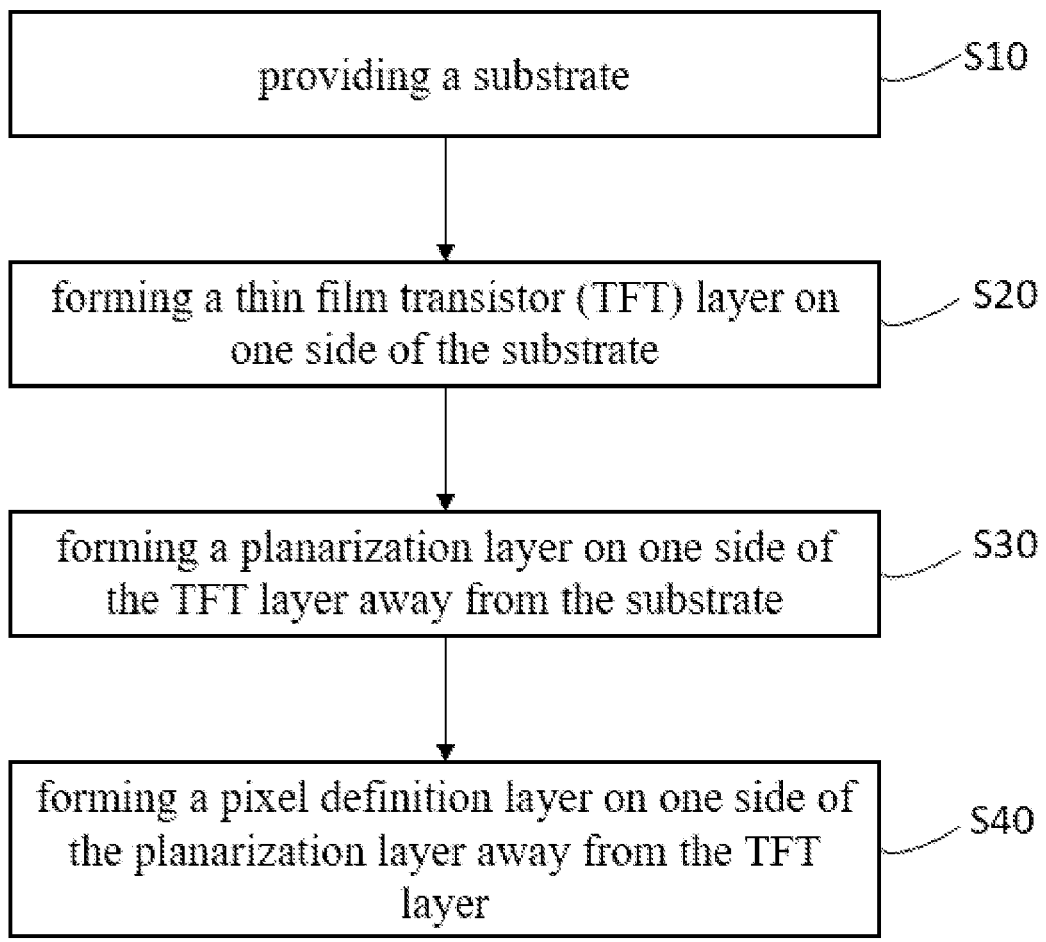
FIG. 17 is a process flow diagram illustrating the manufacturing method of the OLED display panel of the present invention.

In the embodiment shown in FIG. 14, materials of a hole injection layer, a hole transport layer, a light-emitting layer, an electron input layer, and an electron injection layer are injected by inkjet printing and are baked by VCD to form the light-emitting layer 174 shown in FIG. 15. In particular, in the present embodiment, the materials of the above-mentioned hole injection layer, hole transport layer, light-emitting layer, electron input layer, and electron injection layer in the light-emitting layer 174 are preferably injected by inkjet printing. However, in other different embodiments, the light-emitting layer 174 can include a multi-layer structure constituted by a combination of the above-mentioned five layers, and the present application is not limited in this regard. In the embodiment shown in FIG. 15, the cathode 176 (as shown in FIG. 16) is formed by evaporation deposition. Due to a design of the second metal trace electrode 177, the cathode 176 has great designability, which can effectively reduce a voltage drop (IR drop) of the large-sized OLED display panel 100 having a top-emission structure, thereby achieving uniform display.

The OLED display panel 100 also includes the encapsulation layer 190. The planarization layer 150 and the pixel definition layer 160 are formed in the display area AA. The planarization layer 150 has a first side surface 152 close to the non-display area NDA, and the pixel definition layer 160 has a second side surface 166 close to the non-display area NDA. The encapsulation layer 190 covers the cathode 176 of the display area AA, the first side surface 152, and the second side surface 166. Specifically, in the non-display area NDA, the pixel definition layer 160 and the planarization layer 150 are not disposed. That is to say, the non-display area NDA is fully covered by the encapsulation layer 190, which effectively prevents entry of external oxygen/moisture, thereby improving reliability and prolonging a service life of most devices in the display region AA.

The encapsulation layer 190 further includes a first inorganic encapsulation layer 192, an organic encapsulation layer 194 (TEF), and a second inorganic encapsulation layer 196. However, in other different embodiments, the encapsulation layer 190 further includes the above three layers or more layers, or other different combinations, and the present application is not limited in this regard. The first inorganic encapsulation layer 192 and the second inorganic encapsulation layer 196 are preferably made of silicon oxide (SiO), and the organic encapsulation layer 194 is preferably made of silicon nitride (SiN) or silicon oxynitride (SiNxOy).

The step of preparing the encapsulation layer 190 on the cathode 176 further includes depositing a first inorganic encapsulation layer 192 by CVD, inkjet printing an organic encapsulation layer 194 on the first inorganic encapsulation layer 192, and depositing a second inorganic encapsulation layer 196 on the organic encapsulation layer 194. However, in other different embodiments, the encapsulation layer 190 further includes the above three layers or more layers or other combinations of layers, and the present application is not limited in this regard. The first inorganic encapsulation layer 192 and the second inorganic encapsulation layer 196 are preferably made of silicon oxide, and the organic encapsulation layer 194 is preferably made of silicon nitride or silicon oxynitride, as shown in FIG. 16.

It should be noted that, in order to better improve inkjet printing quality, the pixel definition layer 160 can include two layers (as shown in FIG. 4). The pixel definition layer 160 includes a hydrophilic organic layer 162 and a hydrophobic layer 164 deposited on the hydrophilic organic layer 162. Specifically, a bottom layer of the pixel definition layer 160 is the hydrophilic organic layer 162, so that ink can be spread out to the greatest extent, and the top layer of the pixel definition layer 160 is the hydrophobic layer 164, so that ink does not remain on a surface of the pixel definition layer 160. A thickness of the hydrophilic organic layer 162 is greater than or equal to a thickness of the hydrophobic layer 164. In a preferable embodiment, the thickness of the hydrophilic organic layer 162 is 4000 Å, and the thickness of the hydrophobic layer 164 is 10000 Å.

In the light-emitting layer 174 (in each pixel unit P) of the display area AA, the via holes (i.e., the first via holes 180 and the second via holes 182 communicating each other) are defined in the pixel definition layer 160 and the planarization layer 150, the via holes between the pixel units P can effectively block moisture and oxygen from entering the pixel definition layer 160 and the planarization layer 150. Accordingly, even if encapsulation for one single pixel unit P fails, normal operations of other pixel units are not affected, thereby increasing reliability of display operations of most of the pixel units P in the display area (AA) and prolonging a service life of the OLED display panel 100.

A third via hole 186 is formed between the TFTs and in a position corresponding to the first via hole 180, and through the third via hole 186, the cathode 176 is electrically connected to the first metal trace layer 112 (as a ground voltage trace, VSS) disposed corresponding to the first via hole 180, which can also effectively reduce a voltage drop (IR drop) of the large-sized OLED display panel 100 having a top emission structure, thereby achieving uniform display. In addition, the pixel definition layer 160 and the planarization layer 150 can be not disposed in the non-display area NDA, that is, the non-display area NDA is fully covered by the encapsulation layer, which effectively prevents entry of external oxygen and moisture, thereby increasing reliability and a service life of most of devices in the display area AA.

In summary, although the present invention has been described in conjunction with specific embodiments thereof, it should be understood that many alternatives, modifications, and variations will be apparent to those skilled in the art. Accordingly, all alternatives, modifications and variations should fall within the protection scope of the appended claims.

What is claimed is:

1. An organic light-emitting diode (OLED) display panel, comprising:
   a substrate;
   a thin film transistor (TFT) layer disposed on one side of the substrate;
   a planarization layer disposed on one side of the TFT layer away from the substrate; and
   a pixel definition layer disposed on one side of the planarization layer away from the TFT layer;
   wherein a plurality of first via holes are defined in the planarization layer, a plurality of second via holes and a through hole are defined in the pixel definition layer, and each first via hole is directly connected to a corresponding one of the second via holes; the OLED display panel further comprises a light-emitting device layer; the light-emitting device layer comprises an anode, a light-emitting layer, and a cathode sequentially arranged on one side of the planarization layer away from the TFT layer; and the anode is electrically connected to the TFT layer, the light-emitting layer is disposed in the through hole, and the cathode extends continuously while covering the pixel definition layer, the first via holes, the second via holes, and the light-emitting layer,
   wherein the OLED display panel comprises a display area and a non-display area disposed at a periphery of the display area, and at least one of the first via holes and at least one of the second via holes are defined between the display area and the non-display area,
   wherein the OLED display panel further comprises an encapsulation layer, the planarization layer and the pixel definition layer are disposed in the display area, the planarization layer comprises a first side surface close to the non-display area, the pixel definition layer comprises a second side surface close to the non-display area, the first side surface and the second side surface define part of inner walls of each first via hole and each second via hole between the display area and the non-display area, and the encapsulation layer extends continuously while covering the cathode of the display area, the first side surface, and the second side surface.

2. The OLED display panel according to claim 1, wherein the display area comprises a plurality of pixel units, and between at least two adjacent pixel units, one of the first via holes and one of the second via holes are defined.

3. The OLED display panel according to claim 1, wherein the OLED display panel further comprises a first metal layer disposed between the substrate and the TFT layer, the TFT layer comprises a plurality of TFTs arranged in an array pattern and a plurality of third via holes defined between the TFTs, and one of the third via holes is defined at a position corresponding to one of the first via holes.

4. The OLED display panel according to claim 3, wherein the first metal layer comprises a light shielding layer arranged corresponding to the TFTs and a first metal trace layer arranged corresponding to the one of the first via holes, and the cathode is electrically connected to the first metal trace layer through the corresponding third via hole.

5. The OLED display panel according to claim 3, wherein the TFT layer comprises a buffer layer, a semiconductor layer, a gate insulating layer, a gate layer, an interlayer dielectric layer, and a second metal layer sequentially arranged on one side of the first metal layer away from the substrate; the second metal layer comprises a source-drain layer connected to the semiconductor layer and a first metal trace electrode disposed corresponding to the first metal trace layer; and the first metal trace electrode electrically connects the cathode to the first metal trace layer through the corresponding third via hole.

6. The OLED display panel according to claim 5, wherein the OLED display panel further comprises a third metal layer disposed on one side of the TFT layer away from the substrate, the third metal layer comprises the anode and a second metal trace electrode disposed in a same layer as the anode, and the second metal trace electrode is electrically connected to the first metal trace electrode.

7. The OLED display panel according to claim 6, wherein one of the first via holes and one of the second via holes communicating with each other expose at least a portion of the second metal trace electrode, and wherein the cathode is connected to the second metal trace electrode through the first via hole and the second via hole.

8. A manufacturing method of an organic light emitting diode (OLED) display panel, comprising following steps:
   providing a substrate;
   forming a thin film transistor (TFT) layer on one side of the substrate;
   forming a planarization layer on one side of the TFT layer away from the substrate; and
   forming a pixel definition layer on one side of the planarization layer away from the TFT layer;
   wherein a plurality of first via holes are formed in the planarization layer, a plurality of second via holes and a through hole are formed in the pixel definition layer, and each of the first via holes is directly connected to a corresponding one of the second via holes; and the OLED display panel further includes a light-emitting device layer, the light-emitting device layer includes an anode, a light-emitting layer, and a cathode sequentially formed on one side of the planarization layer away from the TFT layer, the anode is electrically connected to the TFT layer, the light-emitting layer is formed in the through hole, and the cathode extends continuously while covering the pixel definition layer, the first via holes, the second via holes, and the light-emitting layer,
   wherein the OLED display panel comprises a display area and a non-display area disposed at a periphery of the display area, and at least one of the first via holes and at least one of the second via holes are defined between the display area and the non-display area,
   wherein the OLED display panel further comprises an encapsulation layer, the planarization layer and the pixel definition layer are disposed in the display area, the planarization layer comprises a first side surface close to the non-display area, the pixel definition layer comprises a second side surface close to the non-display area, the first side surface and the second side surface define part of inner walls of each first via hole and each second via hole between the display area and the non-display area, and the encapsulation layer extends continuously while covering the cathode of the display area, the first side surface, and the second side surface.

9. The manufacturing method of the OLED display panel according to claim 8, wherein the display area comprises a plurality of pixel units, and between at least two adjacent pixel units, one of the first via holes and one of the second via holes are defined.

10. The manufacturing method of the OLED display panel according to claim 8, wherein the OLED display panel further comprises a first metal layer disposed between the substrate and the TFT layer, the TFT layer comprises a plurality of TFTs arranged in an array pattern and a plurality of third via holes defined between the TFTs, and one of the third via holes is defined at a position corresponding to one of the first via holes.

11. The manufacturing method of the OLED display panel according to claim 10, wherein the first metal layer comprises a light shielding layer arranged corresponding to the TFTs and a first metal trace layer arranged corresponding to one of the first via holes, and the cathode is electrically connected to the first metal trace layer through the corresponding third via hole.

12. The manufacturing method of the OLED display panel according to claim 10, wherein the TFT layer comprises a buffer layer, a semiconductor layer, a gate insulating layer, a gate layer, an interlayer dielectric layer, and a second metal layer sequentially arranged on one side of the first metal layer away from the substrate; the second metal layer comprises a source-drain layer connected to the semiconductor layer and a first metal trace electrode disposed corresponding to the first metal trace layer; and the first metal trace electrode electrically connects the cathode to the first metal trace layer through the corresponding third via hole.

13. The manufacturing method of the OLED display panel according to claim 12, wherein the OLED display panel further comprises a third metal layer disposed on one side of the TFT layer away from the substrate, the third metal layer comprises the anode and a second metal trace electrode disposed in a same layer as the anode, and the second metal trace electrode is electrically connected to the first metal trace electrode.

14. The manufacturing method of the OLED display panel according to claim 13, wherein one of the first via holes and one of the second via holes communicating with each other expose at least a portion of the second metal trace electrode, and wherein the cathode is connected to the second metal trace electrode through the first via hole and the second via hole.

15. The manufacturing method of the OLED display panel according to claim 8, wherein the pixel definition layer further comprises a hydrophilic organic layer and a hydrophobic layer deposited on the hydrophilic organic layer, and a thickness of the hydrophilic organic layer is greater than or equal to a thickness of the hydrophobic layer.

16. The manufacturing method of the OLED display panel according to claim 8, wherein the encapsulation layer further comprises a first inorganic encapsulation layer, an organic encapsulation layer inkjet printed on the first inorganic encapsulation layer, and a second inorganic encapsulation layer deposited on the organic encapsulation layer, or a combination thereof, and the first inorganic encapsulation layer and the second inorganic encapsulation layer are made of silicon oxide.

* * * * *